United States Patent

Boland et al.

Patent Number: 5,559,384
Date of Patent: Sep. 24, 1996

[54] CONTROLLED LEVITATION/SUSPENSION IN A MAGNET-SUPERCONDUCTOR SYSTEM

[75] Inventors: John J. Boland, Stormville; Derek B. Dove, Mt. Kisco; Takeshi Takamori, Mahopac, all of N.Y.

[73] Assignee: International Business Machines Corporation, Armonk, N.Y.

[21] Appl. No.: 41,275

[22] Filed: Mar. 29, 1993

Related U.S. Application Data

[63] Continuation-in-part of Ser. No. 919,702, Jul. 24, 1992, abandoned, which is a continuation of Ser. No. 451,915, Dec. 15, 1989, abandoned, which is a continuation-in-part of Ser. No. 370,487, Jun. 23, 1989, abandoned.

[51] Int. Cl.$^6$ .................................................. H02K 7/09
[52] U.S. Cl. ..................... 310/90.5; 335/216; 505/166; 505/879
[58] Field of Search ................. 335/216; 310/90.5; 505/166, 879

[56] References Cited

U.S. PATENT DOCUMENTS

| | | | |
|---|---|---|---|
| 4,843,504 | 6/1989 | Barnes | 360/106 |
| 4,879,537 | 11/1989 | Marshall et al. | 335/216 |
| 4,886,778 | 12/1989 | Moon et al. | 505/1 |
| 4,892,863 | 1/1990 | Agarwala | 505/1 |
| 4,939,120 | 7/1990 | Moon et al. | 335/216 |
| 5,015,622 | 4/1991 | Ward et al. | 505/1 |
| 5,061,679 | 10/1991 | Weeks, II | 310/90.5 |

FOREIGN PATENT DOCUMENTS

| | | |
|---|---|---|
| 404147 | 12/1990 | European Pat. Off. . |
| 299760 | 12/1988 | Japan . |

*Primary Examiner*—Leo P. Picard
*Assistant Examiner*—Raymond M. Barrera
*Attorney, Agent, or Firm*—Robert M. Trepp

[57] ABSTRACT

A three way system for providing controlled levitation or suspension in a magnet-superconductor system, including a current-carrying conductor (such as a coil) for affecting interactions in the magnet-superconductor system, for example by producing a magnetic field intercepting the superconductor, thereby affecting the flux penetration and/or flux pinning properties of the superconductor. By varying the magnitude of the control current the magnitude of the field produced by the coil varies which in turn varies the magnetic interactions in the magnet-coil-superconductor system. This provides a controllable and stable range of levitation, suspension distances, and rotation in the system. Any type II superconductor can be used, but particular advantages are obtained when high $T_c$ superconductors are used. This apparatus has utility and applications such as storage where the enhanced levitation or suspension effects can be used to create a bearing, or for the precise placement of one element with respect to another, as for instance a slider carrying a recording head over a storage medium.

38 Claims, 3 Drawing Sheets

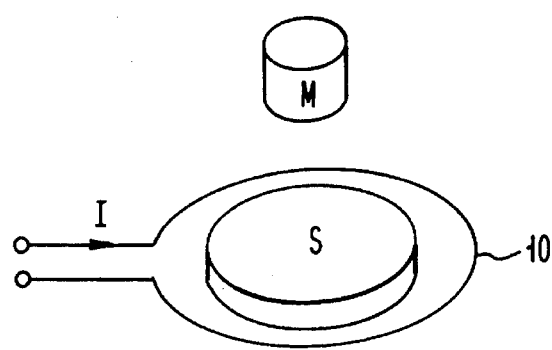
FIG. IA
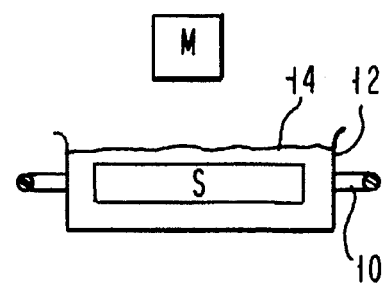
FIG. IB
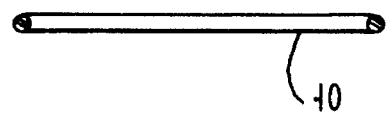
FIG. 6
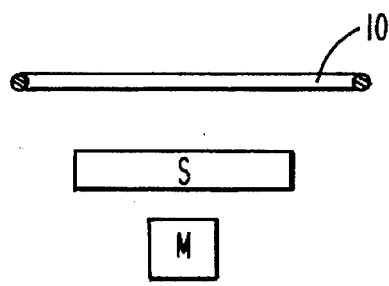
FIG. 2
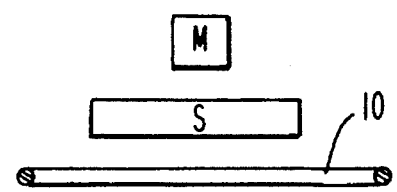
FIG. 3

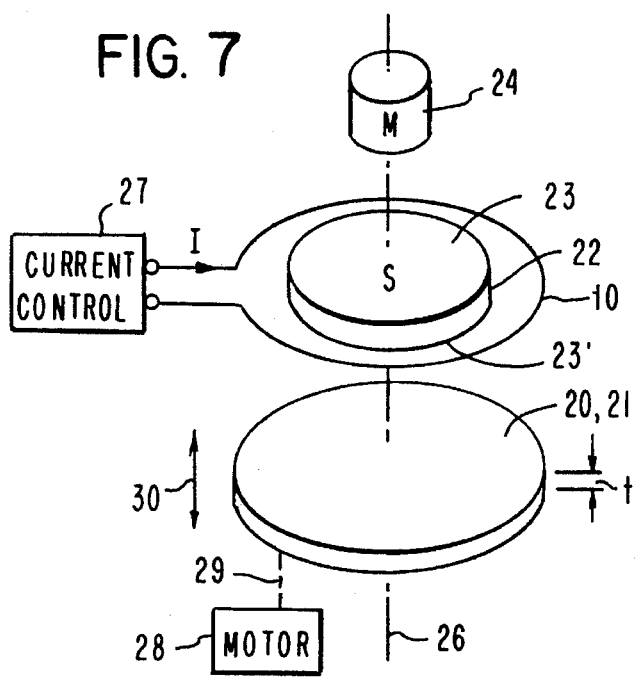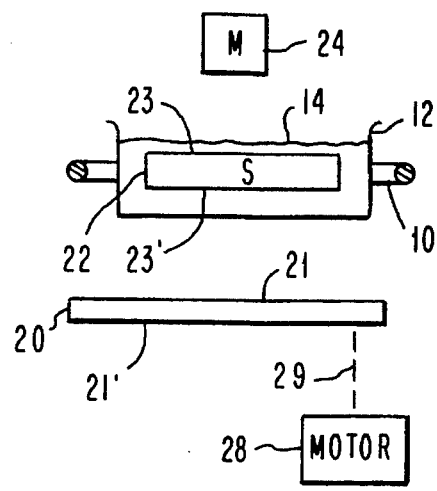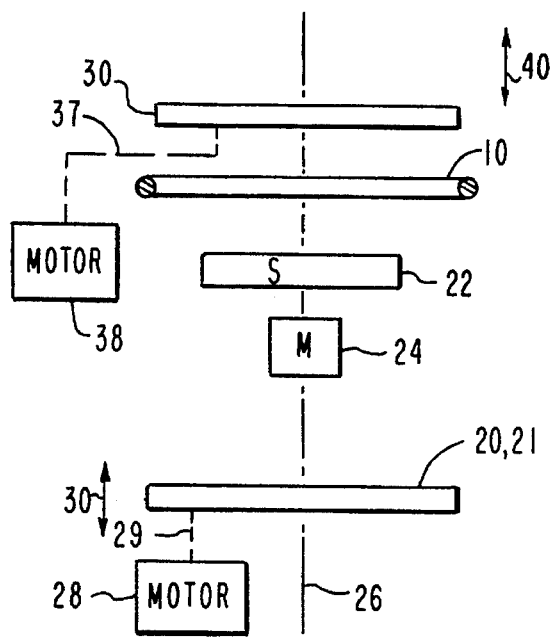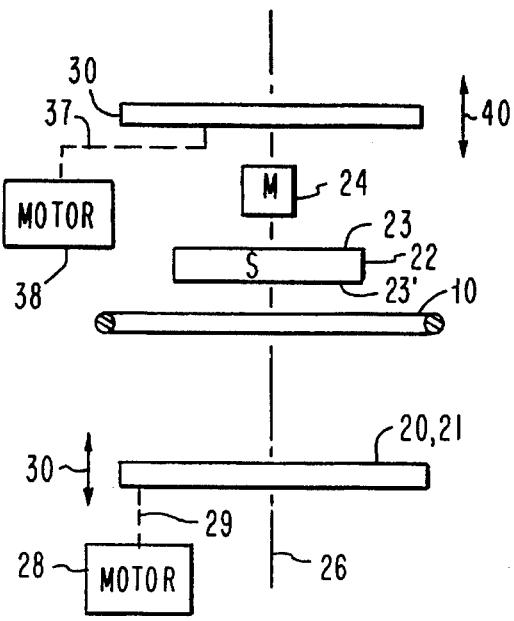

CONTROLLED LEVITATION/SUSPENSION IN A MAGNET-SUPERCONDUCTOR SYSTEM

This application is a CIP of Ser. No. 07/919,702, filed Jul. 24, 1992, now abandoned, which is a CIP of Ser. No. 07/370,487, filed Jun. 23, 1989, now abandoned.

BACKGROUND OF THE INVENTION

1. Field of the Invention

This invention relates to magnet-superconductor systems in which the levitation and suspension of either the magnet or the superconductor can be controlled, and more particularly to such a system utilizing a current-carrying coil as a control element to provide selective and controllable levitation and suspension effects.

2. Description of the Related Art

With the discovery by Bednorz and Mueller of superconducting effects at higher temperatures, many experiments have been performed relative to the levitation of a magnet above a superconductor cooled to liquid nitrogen temperatures. In these experiments, a superconductor can freely float above a permanent magnet, or vice versa, as a demonstration of superconductivity at elevated temperatures. This effect is seen in type I superconductors and also in type II superconductors having no flux penetration below $H_{c1}$. The Meissner effect is used to explain this levitation.

The following technical articles describe levitation in magnet-superconductor systems and explain the effects occurring with both type I and type II superconductors.

1. E. H. Brandt, Appl. Phys. Lett. 53 (16), p. 1554, Oct. 17, 1988.
2. F. Hellman et al, J. Appl. Phys. 63 (2), p. 447, Jan. 15, 1988.

While it had been generally considered necessary to use a type I superconductor or a type II superconductor below $H_{c1}$, where a complete Meissner effect exists, levitation can work equally well with a type II superconductor between $H_{c1}$ and $H_{c2}$. In both systems, the height of the levitation depends on variables such as the thickness of the superconducting disk and the size of the magnet. Hellman et al used a model based on the energy costs of flux penetration through vortices in the superconductor to explain levitation with type II superconductors between $H_{c1}$ and $H_{c2}$.

The Brandt technical paper describes the presence of friction in systems using type II superconductors, the friction enabling a continuous range of stable equilibrium positions and orientations to be obtained in the floating magnet or superconductor. This strong internal friction indicates the existence and unpinning of flux lines in the superconductors. The magnet force on levitated type II superconductors even with weak pinning of flux lines is shown to be hysteretic, providing a stable, almost rigid levitation and a continuous range of stable positions and orientations which increases with increasing pinning strength.

In addition to these interesting levitation effects, suspension effects have been observed in systems utilizing high $T_c$ superconductors and permanent magnets. An early paper describing the stable suspension of a silver oxide doped high $T_c$ superconductor below a permanent magnet is P. N. Peters et al, Appl. Phys. Lett. 52 (24), p. 2066, Jun. 13, 1988. The oxide superconductor used in the experiments of Peters et al was $YBa_2Cu_3O_x$ into which silver oxide was added to limit intergrain resistances which limit high critical currents. Peters et al provide a model for the suspension effect, explaining it in terms of many current loops with weak links surrounding vortices. When the silver oxide doped 1–2–3 superconductor is moved in the field of a permanent magnet the induced currents may exceed the critical currents in some of the loops and allow flux to penetrate or to leave the superconductor. The flux trapped in the superconductor produces a force which tends to hold the sample at a fixed position in the external magnet field.

W. G. Harter et al, Appl. Phys. Lett. 53 (12), p. 1119, Sep. 19, 1988, describe levitation and suspension effects using high $T_c$ thallium-based superconductors. These superconductors provide an effect similar to those found in Y-Ba-Cu-O superconductors, and exhibit very stable suspension or levitation equilibrium positions.

Another paper describing the magnetic hysteresis effect in silver oxide doped superconductor-permanent magnet systems is C. Y. Huang et al, Mod. Phys. Lett. B, 2, 869 (1988). This is a follow-up paper to the P. N. Peters et al paper first reporting the suspension effect using silver oxide doped $YBa_2CuO_x$ superconductors. Magnetic suspension effects in superconductors at 4.2K are described by R. J. Adler et al in Appl. Phys. Lett. 53 (23), p. 2346, Dec. 5, 1988. The superconductors used in this experiment were $NB_3Sn$ and undopod $YBa_2Cu_3O_x$.

In a paper entitled "Flux Penetration in High $T_c$ Superconductors: Implications for Magnetic Suspension and Shielding" published in Appl. Phys. A48, pp. 87–91 (1989) by D. D. Marshall et al, both levitation and suspension effects are described. Focusing of the magnetic field lines by the superconductor is noted, as well as the existence of stable equilibrium suspension. These stable equilibria are shown to be related directly to hysteresis observed in the force-separation relation for a magnet and the superconductor. Observations were made that the levitation height of a magnet increases with magnet size, which is contrary to what would be expected from the literature.

While the references describe both levitation and suspension of a magnet with respect to a superconductor, and the attainment of a range of positions, no teaching or suggestion is made for the attainment of a continuous range of positions using an external control. In a practical system, it would not be desirable to have to reach into the system to manually change the position of the magnet relative to the superconductor. Rather, what is needed is a control for providing selectivity so that a continuous range of positions can be achieved, the range being greater than the limited range available using the techniques described by these references. Thus, it is a primary object of the present invention to provide an apparatus for modifying the attractive and repulsive interactions in the superconductor-magnet system to allow more stable and controllable levitation and suspension effects.

It is another object of the present invention to provide a magnet-superconductor system in which an external control is used to provide a continuous range of stable relative positions in the magnet-superconductor system, and also to provide stable rotational effects about an equilibrium position.

It is another object of this invention to provide a structure and technique for increasing the pinning forces in the superconductor of a superconductor-magnet system, by modifying the magnetic field of the magnet-superconductor system.

It is another object of this invention to provide a magnet-superconductor system in which the attractive and repulsive forces existing between the magnet and the superconductor can be varied over a continuous range, the range being greater than that which would exist without the external control.

It is another object of this invention to provide a three-way system including a magnet, a type II superconductor, and an external control in which the orientation of the magnetic moment of the levitated or suspended magnet is adjustable over a range of angles.

It is another object of this invention to provide a magnet-superconductor system including magnetic field control means which makes it possible to suspend a much higher mass than has been previously possible.

SUMMARY OF THE INVENTION

A superconductor-magnet system is enhanced by the addition of a current carrying conductor, such as a coil, or coils, to affect the magnet-superconductor system, as by altering the magnetic flux penetration and/or flux pinning properties of the superconductor, thereby forming a three-way system which permits a continuous range of levitation and suspension distances to be obtained. In particular, the ranges of continuous levitation and suspension are greater than those known previously, and much larger masses call be suspended than was previously possible.

The current carrying coil can be placed in the same plane as the superconductor, in a plane above the superconductor, or in a plane below the superconductor. The superconductor is any type II superconductor, including any high $T_c$ superconductor. Examples include, but are not limited to, the Y-Ba-Cu-O, Bi-based oxide superconductors and Tl-based oxide superconductors, as well as the metallic and alloy type II superconductors.

Current through the coil produces a magnetic field which aids or retards flux penetration in the superconductor, and in this manner affects the repulsive and attractive forces existing between the magnet and the superconductor. By changing the orientation of the magnetic field with respect to the superconductor, or by changing the magnitude of current through the coil, the magnet can be made to levitate or suspend with respect to the superconductor over a continuous range of distances, the ranges being greater than those achieved in the art. Furthermore, the orientation of the magnet can be continuously changed with respect to the superconductor so that its magnetic moment is either perpendicular to the plane of the superconductor or parallel to it, with a continuous range of rotational orientations depending on the magnitude of current through the coil or the direction of the magnetic field produced by the coil.

Combinations of superconductors can be used, as well as combinations of current carrying coils. This invention has utility in various apparatus where the levitation or suspension can be used to create a bearing or to provide controlled positioning of one element with respect to another. An example is the positioning of a magnetic head with respect to a magnetic storage medium, while another example is in the use of switches where the position of the magnet can be varied depending on the desired switch position.

These and other objects, features, and advantages will be apparent from the following more particular description of the preferred embodiments.

BRIEF DESCRIPTION OF THE DRAWINGS

FIG. 1A schematically represents an apparatus for carrying out this invention, utilizing a current-carrying coil to effect flux penetration in a superconductor.

FIG. 1B is a side view of the apparatus of FIG. 1A, illustrating that the coil is essentially coplanar with the superconductor, and showing a cooling means not shown in FIG. 1A.

FIG. 2 is a side view of an apparatus wherein the coil is located on the opposite side of the superconductor as a magnet which is controllably and stably suspended beneath the superconductor.

FIG. 3 rates an arrangement where the coil and the magnet are located on opposite sides of the superconductor, the coil being used to stably control the orientation and levitation height of a magnet above the superconductor.

FIG. 6 illustrates the coil magnet-superconductor system in which levitation magnet M is shown above superconductor S.

FIG. 7 is an alternative embodiment of the invention.

FIG. 8 is a side view of FIG. 7.

FIG. 9 shows a second alternate embodiment of the invention.

FIG. 10 shows a third alternate embodiment of the invention.

DETAILED DESCRIPTION OF THE PREFERRED EMBODIMENT

Figure 4A:
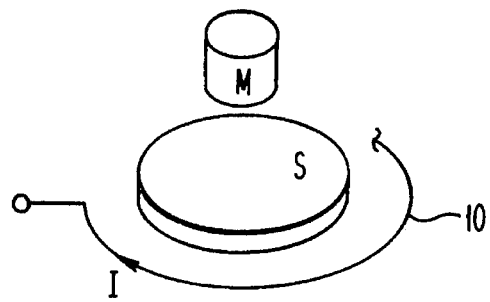
FIGS. 4A–4C illustrate the use of a coil located below a superconductor to influence the levitation height and orientation of a magnet above a superconductor, depending on the magnitude of current through the coil.

The system including a type II superconductor, a magnet, and a current carrying coil can be used to produce a continuous range of distances where stable levitation and suspension of a permanent magnet may be obtained, and where the orientation of the magnetic moment of the levitated or suspended magnet is also adjustable over a wide range of angles. The use of the current-carrying coil makes it possible to suspend much higher masses than was previously accomplished. In fact, masses 10–20 times larger than those previously reported can be suspended using this apparatus. An advantage is that the superconductor can be maintained in a fixed position, allowing simple cooling, in contrast with prior suspension demonstrations wherein the lighter superconductor was suspended below a magnet. In these latter arrangements, cooling of the superconductor is impeded.

The superconductor-magnet-current carrying coil of the present invention is used to alter the repulsive and attractive interactions between the magnet and the superconductor and in particular to affect the flux penetration and/or flux pinning in the superconductor, thereby affecting the magnet superconductor interaction. Of course, if current through the coil is too low, flux penetration will not be affected and the system will become the conventional 2-way system described in the prior art. On the other hand, if current in the coil becomes too great, flux penetration in the superconductor can increase to an amount greater than $H_{c2}$ wherein the superconductor will lose its superconducting properties. In operation, the current through the coil is typically adjusted so that the flux penetration of the superconductor is between the limits $H_{c1}$ and $H_{c2}$.

As mentioned previously, any type II superconductor can be used including both metals and alloys which are low temperature superconductors, as well as the well known high $T_c$ superconductors. Examples of the latter include Y-based copper oxide material, Bi-based copper oxide materials, and Tl-based copper oxide superconductors. Other oxide superconductors can also be used, including those which do not contain copper. These materials are well known in the art, and are described in more detail in the aforementioned references.

The magnet can be comprised of any material exhibiting a magnetic moment, or combinations of materials. Its geometry is arbitrary and can be a flattened element, a cylindrical shaped element, a wire or rod, or a generally rectangle element. It's shape and particular magnetic properties are not critical in the practice of this invention.

The current-carrying coil, or coils, can take any form and can have various locations relative to the superconductor. For example, the coil can include a conductor with or without a core of soft magnetic material to enhance or shape the magnetic field that is produced by current in the conductor. Other suitably placed magnetic elements can also be used to modify the magnetic field. Generally, the component of the magnetic field produced by the coil which is of greatest interest in the present invention is that component which will influence flux penetration in the superconductor. For a disk-shaped superconductor, this component is that which is substantially perpendicular to the plane of the disk-shaped superconductor. However, it will be appreciated by those of skill in the art that a magnetic field component substantially parallel to the plane of the superconductor may have some effect on the lateral stability of the magnet with respect to the superconductor even though the flux penetration of the superconductor is not affected by such a magnetic field component. Further, it will be appreciated by those of skill in the art that the coil can be replaced by a plurality of coils to provide magnetic field components in X, Y, and Z directions. Still further, the position of a single coil with respect to the superconductor can be varied to be above or below the superconductor or at an angle with respect to the plane of the superconductor. Generally, the coil is oriented so that the magnetic field produced by current through the coil will have an impact on flux penetration in the superconductor, thereby affecting the magnet-superconductor interaction. Examples will be given to illustrate these principles with respect to both levitation and suspension of the magnet with respect to the superconductor.

Referring more particularly now to the drawings, FIG. 1A illustrates a simple apparatus for providing a range of stable positions of levitation and suspension in the magnet-superconductor system. As in all the figures, the magnet will be designated M, while the superconductor is designated S. In these drawings, the superconductor is disk-shaped for ease of illustration, but it should be understood that the superconductor can have any shape, including that of a sphere, a rod, a thin film, line, etc. Since the superconductor provides a stable position of the magnet relative to it in order to control lateral stability of the magnet, it will be recognized that certain geometries may be favorable for this purpose. For example, two parallel superconducting strips can be used where the magnet is levitated or suspended with respect to the superconducting strips and is laterally equidistant between the strips. Thus, any number of superconducting elements of varying geometry can be used in the practice of this invention, the number of superconductors, their geometry, and the relative positioning of one relative to the others can be varied in accordance with the particular application to which this invention is applied. For example, if a recording head is to be displaced relative to a recording medium, the superconductor could be a superconducting strip or line disposed along a slider arm.

FIG. 1A illustrates an arrangement in which a magnet M is levitated above a superconductor S, the levitation height being controlled by current I in the coil 10. FIG. 1B is a side view of the arrangement of FIG. 1A illustrating that the coil 10, in this arrangement, has its plane essentially coplanar with the plane of the superconductor S. In other figures, different arrangements and locations of the coil relative to the superconductor will be illustrated. FIG. 1B also includes a cooling means for the superconductor, illustrated herein as the vessel 12 containing a coolant 14 such as liquid nitrogen.

FIGS. 2 and 3 illustrate arrangements in which the magnet M is located on the opposite side of the superconductor S from the coil 10, where FIG. 2 illustrates the suspension of the magnet below the superconductor while FIG. 3 illustrates the levitation of the magnet above the superconductor. Generally, the diameter of the coil 10 is chosen to be sufficiently large that flux penetration is affected in a substantial portion of the superconductor. Of course, the magnetic field produced by coil 10 could be concentrated to affect flux penetration in a portion of the superconductor rather than across the entire diameter of the superconductor.

Figure 4B:
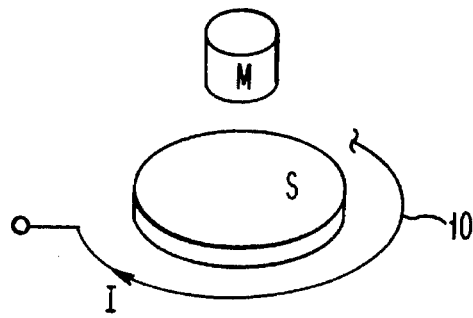
Figure 4C:
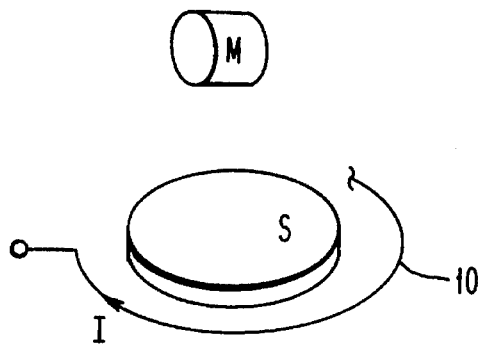

FIGS. 4A–4C illustrate changes in levitation height of the magnet M above superconductor S, where the change of height is due to a change in flux penetration of superconductor S which in turn is produced by varying current I in the coil 10. In addition to the change in levitation height, it will be seen that the magnet rotates so that its magnetic moment changes from an orientation perpendicular to the plane of superconductor S to an orientation parallel to the plane of superconductor S when it is elevated to its maximum height (FIG. 4C). A laboratory demonstration detailing this will be presented in one of the following examples.

Figure 5:
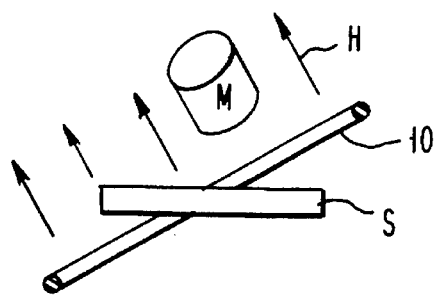
FIG. 5 represents the use of a coil disposed at an angle to the plane of the superconductor, in order to influence the rotational orientation of the magnet levitated above the superconductor. Rather than an inclined coil, both X and Y-coils, or multiple sets of coils, can be used to provide magnetic fields in different orientations.

In FIG. 5 the coil 10 is tilted with respect to the plane of superconductor S, and produces a magnetic field indicated by the arrows H which is disposed at an angle to the plane of superconductor S. This tilted field is used to affect the coupling between the magnet and the superconductor such that the magnet M is rotationally disposed with its magnetic moment at an angle which is approximately the angle of the magnetic field H with respect to the plane of superconductor S. By varying the rotational orientation of field H, the magnet-superconductor interaction can be altered such that the magnetic moment of the magnet will vary with respect to the plane of the superconductor. This could be used to produce a continuous range of rotational displacements of the magnet. Rather than changing the tilt angle of the coil, it will be appreciated that combinations of coils can be used to provide magnetic fields along the plane of the superconductor as well as perpendicular to the superconductor, and that currents in these coils can be changed to affect the direction of the resultant in the magnetic field. In this manner, the resultant field can be made to lie along the plane of the superconductor or perpendicular to the plane of the superconductor, as well as any orientation between these two extremes.

EXAMPLE I

A disk of the high $T_c$ superconductor, $YBa_2Cu_3O_x$, 36 mm in diameter and 8 mm thick, was prepared by several grinding and sintering steps. A cylindrical magnet was used having 10 mm diameter, a length of 7 mm, and a weight of 4.5 g. The magnetic moment of the magnet was parallel to the cylinder axis with a magnetic field at the surface of the magnet of 3.6K gauss, as measured by a Hall Effect gaussmeter. The superconducting disk was placed in a petrie dish and cooled down by direct contact with liquid nitrogen. The magnet was levitated over the superconductor either by bringing the magnet close to the superconductor surface before releasing it or by cooling with the magnet resting on the surface of the superconductor. In either case the magnet levitated such that its moment was parallel to the surface of the superconducting disk.

In this example and the others to follow, a coil was used which was fabricated of enameled copper wire (30 mils. diameter) would around a plexiglass tubing 3.5 inches in diameter. This formed a solenoid 1 inch high. The solenoid exerted an increasing magnetic field with increasing electrical current, producing a field of approximately 80 gauss/amp. When a solenoid is placed beneath the superconducting disk, as shown in FIG. 3, flux penetration in the superconductor can be enhanced by the magnetic field produced by current through the solenoid. In this case, the height of the levitated magnet was changed by varying the current through the solenoid, yielding a levitation height range from 0 to several mm. In addition, at each current setting of the solenoid the levitation height could be manually adjusted within the range of several mm. The existence of this stable range of levitation heights affects the controllable height range obtainable with the solenoid. When a current is first turned on, the magnet dropped a little and this initial drop is not recovered even after the current is turned off. From then on the magnet position is a predictable function of the solenoid current. Also, during the initial current increase, the moment of the levitated magnet changed from parallel to the superconducting disk at the maximum height to perpendicular to the disk at zero height. After the current is turned off, the moment of the magnet still makes a slight angle with the plane of the superconducting disk, and recovery of the initial orientation is incomplete. From this point on, the magnet orientation is also predictable over a limited range of angles.

The height of the levitated magnet with the moment parallel to the superconducting disk can be similarly changed. A magnet was placed beneath the superconductor with its moment also parallel to the disk but pointing in the direction opposite to that of the magnet levitated above the disk. It was then possible to manually change the vertical position of the levitated magnet while maintaining its moment parallel to the disk. If an attempt is made to rotate the levitated magnet about the normal to the surface of the superconducting disk by rotating the magnet under the disk, the system is forced to go through an unstable transient state and the magnet can no longer be levitated.

EXAMPLE II

Tests were also made with the suspension of a magnet beneath the superconducting disk. The apparatus for this is shown in FIG. 2 wherein the solenoid 10 is placed over the superconductor S. A high $T_c$ superconductor disk comprising $YBa_2Cu_3O_x$ was used. The magnet was the same as that used in Example I. The maximum field exerted by the solenoid on the surface of the bottom of the petrie dish (which was about 2 mm from the bottom of the superconducting disk) was 80 gauss. At this current setting the magnet was pulled to the bottom of the petrie dish. By turning down the current slowly, the magnet gradually dropped below the petrie dish and was suspended underneath. A further decrease in the current through the solenoid resulted in an increase in the distance between the suspended magnet and the bottom of the petrie dish. When the same magnet was used as in example I it fell at about 2 mm separation. At this maximum separation, the field exerted by the solenoid at the bottom surface of the petrie dish was about 60 gauss. Magnets of several different geometries and strengths have been tested. In all instances, the moment of the suspended magnet was always vertical. Stronger and smaller magnets showed more stable suspension than smaller but weaker ones suggesting the importance of the flux penetration and pinning in the superconductor for successful suspension of the magnet therebelow.

Using this experimental setup, a 3.7K gauss cylindrical magnet, 16 mm long, 14 mm diameter, and weighing 21 g could be suspended beneath the superconductor. In this case, as would be expected, the stable distance between the top of the magnet and the petrie dish was only a small fraction of 1 mm and was sometimes noticeable only by the free rotation of the magnet in space around its axis. The large mass of this magnet is compared with the suspended masses described in the aforementioned references (Peters et al, 0.0538 g and Harter et al, 0.167 g). The combination of the magnetic field produced by the solenoid and the superconductor has made possible a very large increase in the mass that can be suspended.

EXAMPLE III

Magnet suspension of the type described in the previous example was extended. A smaller 2.2K gauss magnet, 6 mm square and 3 mm thick, weighing 1.0 g was used. With a large current through the solenoid, the suspension distance was a fraction of 1 mm from the bottom of the petrie dish while the maximum suspension distance was more than 5 mm away from the petrie dish.

Similarly to the levitation examples, the suspension of a magnet could be manually adjusted within some range of distance to the bottom of the petrie dish. For example, when using the solenoid for the magnet suspension as shown in FIG. 2, the current was gradually decreased to obtain the maximum distance of the magnet from the petrie dish. A moment before the magnet was going to fall, the current was quickly increased back to the current level originally used. The magnet then stayed suspended at the near maximum distance from the bottom of the petrie dish. By pushing up the suspended magnet little by little, it was possible to have a magnet suspended stably from any distance as the petrie dish was approached.

The existence of a range of stable levitation was barely recognizable in a two-component system containing just the magnet and the superconductor. Only with the additional magnetic interactions as illustrated by the foregoing examples is such a range clearly present in both levitation and suspension of a magnet. This contrasts with the prior references where a range of stable levitation heights is seen only in more strongly pinning superconductors (such as silver-containing $YBa_2Cu_3O_x$ and the thalium-based superconductor $Tl_2Ca_2Ba_2Cu_3O_x$. Thus, the $YBa_2Cu_3O_x$ superconductor, modified by the additional magnetic interaction produced by currents in the coil, was now found to behave qualitatively similar to other more strongly pinning superconductors.

EXAMPLE IV

This example illustrates the control of the height and the orientation of the magnet in a levitation experiment. The superconductor is $YBa_2Cu_3O_x$, while the magnet is a cylindrical magnet having dimensions and weight as follows: 10 mm diameter, 7 mm length, 4.5 g mass. The magnetic moment of the magnet was parallel to the cylinder axis. In FIG. 4A, the magnet M is levitated above the disk with some current in the coil while the height of levitation is increased in FIG. 4B by decreasing current in the coil. When the current is decreased sufficiently to cause a maximum levitation height, the magnet rotates so that its magnetic moment is now parallel to the superconductor. This is in contrast with its magnetic moment orientation at higher coil currents, illustrated in FIGS. 4A and 4B, wherein the magnetic moment is perpendicular to the plane of the superconductor.

In practical applications, it is more feasible to levitate or suspend a magnet rather than a superconductor in order to allow continuous cooling of the superconductor. In the aforementioned references, this limitation was particularly apparent in the case of suspension, due to the limited attractive force present in the system utilizing only a superconductor and a magnet. By utilizing the current-carrying coil, a greater attractive force is obtained between the superconductor and the magnet, thereby allowing larger masses to be suspended. This means that instead of suspending the lighter superconductor beneath the magnet, the superconductor can be held stationary while the magnet is suspended.

In the practice of this invention, a technique and apparatus is presented for enhanced levitation and suspension in a magnet-superconductor system. It will be appreciated by those of skill in the art that any type II superconductor can be used although the use of high $T_c$ superconductors is particularly advantageous and unique. These superconductors can be patterned or have a topography to enhance lateral stability of the levitated or suspended magnet (for example, apertures in the superconductor). Further, the coil structure and its geometry and location can be varied to provide different amounts of magnetic-superconductor interaction or flux penetration and/or flux pinning in the superconductor to affect the levitation and suspension height, rotation, etc.

These embodiments have illustrated the use of a current-carrying coil to affect a magnet-superconductor system in a manner to provide enhanced control of levitation and suspension, and to allow larger masses to be levitated and suspended. The embodiment of FIG. 6 represents another example of a coil-magnet-superconductor system in which even greater ranges of levitation height and levitation mass can be achieved. As with the other embodiments, the current-carrying coil is used to affect interactions in the system to achieve these benefits.

Using the same reference designations, FIG. 6 shows a type II superconductor S, a coil 10, and a levitated magnet M. In this figure, solenoid (coil) 10 is located above the superconductor, with the magnet levitated to a position between the coil and the superconductor. Current through coil 10 varies the levitation height and orientation of the magnet, as will be illustrated by the following examples.

EXAMPLE V

The superconductor disk used in the experiments of Examples V–VIII $YBa_2Cu_3O_x$ was purchased from Deposition Technology, McKeesport, Pa. This disk was about 9.5 mm thick and 76 mm in diameter having a nominal purity of 99.9%. It was sintered to 80–85% density. A cylindrical magnet 10 mm in diameter and 7 mm long, weighing 4.5 g, was used in this example. The magnetic moment of the magnet was parallel to the cylinder axis with a magnetic field at the surface of the magnet of 3.6K gauss, as measured by a Hall effect gaussmeter. The superconductor disk was placed in a petrie dish and cooled down by direct contact with liquid nitrogen. The magnet was levitated over the superconductor either by bringing the magnet close to the superconductor surface before releasing it or by cooling with the magnet resting on the surface of the superconductor. In either case the magnet levitated such that its moment was parallel to the surface of the superconducting disk.

In this example and the others to follow, a coil was used which was fabricated of enameled copper wire (30 mils. diameter) wound around a plexiglass tubing 3.5 inches in diameter, forming a solenoid 1 inch high. The solenoid exerted an increasing magnetic field with increasing electric current, producing a field of approximately 80 gauss/amp. The solenoid was placed above the superconductor disk about 70 mm from its surface as shown in FIG. 6. The height of the levitated magnet was changed by varying the current through the solenoid, yielding a levitation height range from initial 7 mm to over 15 mm before the magnet was suddenly pulled toward the solenoid. At the maximum height, the field exerted by the solenoid at the magnet was about 50 gauss. Within this stable range of levitation, the magnet height was a predictable function of the solenoid current. Also, during the initial current increase, the moment of the levitated magnet changed from parallel to the superconducting disk at the minimum height to perpendicular to the disk as a predictable function of the solenoid current. In addition to the levitation height controlled by the solenoid current adjustment, at each current setting of the solenoid the levitation height could be manually adjusted within a few mm range, similar to the levitation examples previously described.

EXAMPLE VI

A small cube magnet having 3 mm edge, weighing 0.4 g with a magnetic field at the surface of the magnet of 1.9K gauss, as measured by a Hall effect gaussmeter, was used in this example. The solenoid was placed above the superconductor disk about 70 mm from its surface. The height of the levitated magnet was changed by varying the current through the solenoid, yielding a levitation height range from an initial 4 mm to over 11 mm before the magnet was suddenly pulled toward the solenoid. At the maximum height, the field exerted by the solenoid at the magnet was about 50 gauss. Within this stable range of levitation, the magnet height was a predictable function of the solenoid current. In addition to the levitation height controlled by the solenoid current adjustment, at each current setting of the solenoid the levitation height could be manually adjusted as in Example V but to a much smaller extent.

EXAMPLE VII

A large rectangular magnet having a half inch square section and 1 inch long, weighing 33.6 g, was used in this example. The magnetic moment of the magnet was perpendicular to the axis of this column shaped magnet with a magnetic field at the surface of the magnet of 3.3K gauss, as measured by a Hall effect gaussmeter. The solenoid was placed above the superconductor disk about 60 mm from its surface. The height of the levitated magnet was changed by varying the current through the solenoid, yielding a levitation height range from an initial 6 mm to over 20 mm before the magnet was suddenly pulled toward the solenoid. At the maximum height, the field exerted by the solenoid at the magnet was about 60 gauss. Within this stable range of levitation, the magnet height was a predictable function of the solenoid current. In addition to the levitation height controlled by the solenoid current adjustment, at each current setting of the solenoid the levitation height could be manually adjusted more than a few mm range.

EXAMPLE VIII

As an example of levitation of an extremely large magnet, an irregularly shaped plane magnet one half inch thick weighing 135.3 g was used in this example. The magnetic moment of the magnet was perpendicular to the plane of the magnet with a magnetic field at the surface of the magnet of 2.8K gauss, as measured by a Hall effect gaussmeter. The solenoid was placed above the superconductor disk about 50 mm from its surface. The magnet was too heavy to show any levitation above the superconductor disk. However, with increasing current through the solenoid, the magnet eventually lifted up to about 15 mm before the magnet was pulled up toward the solenoid. At the maximum height, the field exerted by the solenoid was about 60 gauss. Within this stable range of levitation, the magnet height was a predictable function of the solenoid current. In addition to the levitation height controlled by the solenoid current adjustment, at each current setting of the solenoid the levitation height could be manually adjusted within a few mm range similar to Example V.

With the embodiment of FIG. 6, a stronger magnet responds more effectively, giving a wider height range to control and/or levitating a heavier mass than can be achieved with the embodiment of FIGS. 1–5.

Referring to FIGS. 7 and 8, magnetic material 20 is positioned to modify the magnetic field at the surface and in superconductor 22. Magnetic material 20 may be a soft magnetic material to provide a magnetic flux path for concentrating or increasing the magnetic flux passing through superconductor 22 from magnet 24. Magnetic material 20 may be a plate or sheet of Fe, Ni or Co or alloys thereof and may or may not be a permanent magnet. Magnetic material 20 may have a predetermined thickness t or a variable thickness and patterned or shaped to concentrate or guide the magnetic flux passing through superconductor 22. Superconductor 22 may have an upper surface 23 which is transverse or perpendicular to axis 26. Axis 26 passes through the center of superconductor 22. Axis 26 may also pass through magnet 24 and magnetic material 20. The upper surface 21 of magnetic material 20 is positioned transverse or perpendicular to axis 26.

Motor 28 having a mechanical link 29 to magnetic material 20 provides a means for moving magnetic material 20 with respect to superconnductor 22. Motor 28 may be an actuator, a solenoid, a transducer or a source of force from a liquid or gas such as variable or hydrostatic pressure. Magnetic material 20 may be moved along axis 26 towards superconductor 22 to cause magnet 24 to move stably along axis 26. Thus, in place of varying the current in coil 10 to change the levitation or suspension of magnet 24, motor 28 may move magnetic material 20 towards or away from superconductor 22 as shown by arrow 30 to cause a controllable change in position of the levitation or suspension of magnet 24 with respect to superconductor 22. The current in coil 10 may be changed concurrently with the motion of magnetic material 20 or the current in coil 10 may be constant and or zero during the motion of magnetic material 20.

FIG. 9 shows magnet 24 suspended from superconductor 22. Coil 10 may have current to provide a magnetic field. Magnetic material 20 may be moved by motor 28 towards or away from superconductor 22 to cause a change in suspension of magnet 24 with respect to superconductor 22. Magnetic material 30 may be moved by motor 38 towards or away from superconductor 22 to cause a change in suspension or distance magnet 24 with respect to superconductor 22. Magnetic materials 20 or 30 may be present alone or both magnetic materials 20 and 30 may be present as shown in FIG. 9.

FIG. 10 shows magnet 24 levitated above superconductor 22. In FIGS. 6, 9 and 10 like references are used for functions corresponding to the apparatus of FIG. 1, 6 and 9. Magnetic material 20 or 30 may be moved alone or in concert by motors 28 and 38 towards or away from superconductor 22 to cause a change in levitation or distance of magnet 24 with respect to superconductor 22. Magnetic materials 20 or 30 may be present alone or both magnetic materials 20 and 30 may be present as shown in FIG. 10.

Thus, while the invention has been described with the respect to particular embodiments thereof, it will be apparent to those of skill in the art that variations may be made therein without departing from the spirit and scope of the present invention.

We claim:

1. A device including:

a type II superconductor, a magnet, a conductor through which an electrical current can flow to produce a magnetic field intercepting said superconductor to alter the flux penetration properties of said superconductor, said magnet being capable of suspension or levitation with respect to said superconductor, the levitation or suspension distance being continuously adjustable over a range depending on the magnitude of electrical current through said conductor.

2. The device of claim 1, where said superconductor is a high $T_c$ superconductor.

3. The device of claim 2, where said superconductor contains copper-oxygen current-carrying planes.

4. The device of claim I, where said superconductor is a metal or metal alloy.

5. The device of claim 1, where said conductor is a coil surrounding said superconductor.

6. The device of claim 1, where the magnetic field produced by the current in said conductor intercepts a substantial portion of said superconductor.

7. The device of claim 1, where said conductor and said magnet are located on opposite sides of said superconductor.

8. The device of claim 1, where said conductor is substantially coplanar with a surface of said superconductor.

9. The device of claim 1, where the magnetic field produced by said conductor includes a component substantially perpendicular to a surface of said superconductor.

10. A high $T_c$ superconductor-magnet system for suspension or levitation, comprising: a high $t_c$ superconductor, a magnet, an electrical conductor for carrying an electrical current therein which produces a magnetic field H intercepting at least a portion of said superconductor and affecting the flux penetration properties of said superconductor, and a current means for producing said electrical current in said conductor, said current means being capable of producing an electrical current of varying magnitude for altering the levitation or suspension distance between said magnet and said superconductor and wherein, said magnetic field H is in the range $H_{c1}<H<H_{c2}$ where $H_{c1}$ and $H_{c2}$ are the lower and upper critical fields of said superconductor.

11. The system of claim 10, where said electrical conductor and said magnet are located on opposite sides of said superconductor.

12. A high $T_c$ superconductor-magnet system for suspension or levitation, comprising: a high $t_c$ superconductor, a magnet, an electrical conductor for carrying an electrical current therein which produces a magnetic field intercepting at least a portion of said superconductor and affecting the flux penetration properties of said superconductor, and a current means for producing said electrical current in said conductor, said current means being capable of producing an electrical current of varying magnitude for altering the levitation or suspension distance between said magnet and said superconductor and wherein, said electrical conductor surrounds said superconductor.

13. The system of claim 10, further including cooling means for cooling said superconductor.

14. The system of claim 10, where said conductor forms a coil, the axis of said coil being substantially perpendicular to a surface of said superconductor.

15. The system of claim 10, where said conductor forms a coil, the axis of said coil being at an angle between 0° and 90° with respect to a surface of said superconductor.

16. An apparatus including in combination:

a member having a magnetic moment associated herewith, a high $T_c$ superconductor, electrical means for controllably producing a magnetic field intercepting said superconductor and of sufficient magnitude to alter the flux penetration properties of said superconductor, said electrical means being controllable to produce a magnetic field H of varying strength to vary the levitation or suspension effects between said member and said superconductor and wherein said magnetic field H produced by said electrical means is in the range $H_{c1}<H<H_{c2}$ where $H_{c1}$ and $H_{c2}$ are the lower and upper critical fields of said superconductor.

17. A device including:

a type II superconductor, a magnet said magnet and said superconductor forming a magnet-superconducting system, a conductor through which an electrical current can flow to produce a magnetic field entering said magnet-superconductor system, said magnet being capable of suspension or levitation with respect to said superconductor, the levitation or suspension distance being continuously adjustable over a range depending on the magnitude of electrical current through said conductor.

18. The device of claim 17, where said superconductor is a high $T_c$ superconductor.

19. The device of claim 17, where said magnet is levitated, said magnet being levitated at a position between said superconductor and said conductor.

20. The device of claim 17, where said conductor is a coil.

21. A high $T_c$ superconductor-magnet system for suspension or levitation comprising: a high $T_c$ superconductor, a magnet, said high $T_c$ superconductor and said magnet forming a high $T_c$ superconductor-magnetic system, an electrical conductor for carrying an electrical current therein which produces a magnetic field H intercepting said magnet for affecting interactions in said high $T_c$ superconductor-magnet system, and a current means for producing said electrical current in said conductor, said current means being capable of producing an electrical current of varying magnitude for altering the levitation or suspension distance between said magnet and said superconductor, wherein said magnetic field H is in the range $H_{c1}H< H_{c2}$ where $H_{c1}$ and $H_{c2}$ are the lower and upper critical fields of said superconductor.

22. The system of claim 21, where said electrical conductor is located on the same side of said high $T_c$ superconductor as said magnet.

23. The system of claim 21, where said electrical conductor is a coil.

24. The system of claim 23, where the axis of said coil is substantially perpendicular to a surface of said superconductor.

25. The system of claim 23, where the axis of said coil is at an angle between 0 degrees and 90 degrees with respect to a surface of said superconductor.

26. An apparatus including in combination:

a member having a magnetic moment associated herewith, a high $T_c$ superconductor, electrical means for controllably producing a magnetic field intercepting said superconductor and of sufficient magnitude to alter the flux penetration properties of said superconductor, said electrical means being controllable to produce a magnetic field of varying strength to vary the rotational displacement of said member with respect to said superconductor.

27. The apparatus of claim 26, where said member is levitated, said electrical means being a coil.

28. The apparatus of claim 27, where said member is levitated to a position between said coil and said superconductor.

29. A device including:

a type II supeconductor, a magnet, a conductor through which an electrical current can flow to produce a magnetic field intercepting said superconductor to alter the flux penetration properties of said superconductor, said magnet being capable of suspension or levitation with respect to said superconductor, the levitation or suspension distance being continuously adjustable over a range depending on the magnitude of electrical current through said conductor, and a magnetic element to modify the magnetic field at said superconductor, said magnetic element includes a plate of magnetic material.

30. The device of claim 29 further including means for moving said plate of magnetic material with respect to said superconductor whereby said magnet is moved with respect to said superconductor.

31. A device including:

a type II superconductor, a magnet, a magnetic element, and means for positioning said magnetic element with respect to said superconductor to alter the flux penetration properties of said superconductor, said magnet being capable of suspension or levitation with respect to said superconductor, the levitation or suspension distance being continuously adjustable over a range depending on the position of said magnetic element, said magnetic element includes a plate of magnetic material.

32. The device of claim 31, where said superconductor is a high $T_c$ superconductor.

33. The device of claim 32, where said superconductor contains copper-oxygen current-carrying planes.

34. The device of claim 31, where said superconductor is a metal or metal alloy.

35. The device of claim 31 further including a conductor through which an electrical current can flow to produce a magnetic field intercepting said superconductor to alter the flux penetration properties of said superconductor.

36. The device of claim 35, where said conductor is a coil surrounding said superconductor.

37. The device of claim 35, where the magnetic field produced by said conductor includes a component substantially perpendicular to a surface of said superconductor.

38. The device of claim 31 including means for moving said magnetic element with respect to said superconductor from a first position to a second position whereby said magnet is moved with respect to said superconductor.

* * * * *